(12) United States Patent
Yotsuji

(10) Patent No.: US 11,062,189 B2
(45) Date of Patent: Jul. 13, 2021

(54) FLAG HOLDING CIRCUIT AND FLAG HOLDING METHOD

(71) Applicant: LAPIS SEMICONDUCTOR CO., LTD, Yokohama (JP)

(72) Inventor: Tetsuaki Yotsuji, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 86 days.

(21) Appl. No.: 16/416,275

(22) Filed: May 20, 2019

(65) Prior Publication Data

US 2019/0362207 A1 Nov. 28, 2019

(30) Foreign Application Priority Data

May 24, 2018 (JP) .............................. JP2018-099622

(51) Int. Cl.
*G06K 19/07* (2006.01)
*H02J 7/00* (2006.01)
*H03K 3/037* (2006.01)
*H02J 7/34* (2006.01)

(52) U.S. Cl.
CPC ..... *G06K 19/0709* (2013.01); *G06K 19/0723* (2013.01); *H02J 7/0068* (2013.01); *H02J 7/345* (2013.01); *H03K 3/0377* (2013.01)

(58) Field of Classification Search
CPC . G06K 19/0709; G06K 19/0723; G06K 19/07
See application file for complete search history.

(56) References Cited

U.S. PATENT DOCUMENTS

| 5,805,508 | A  | * | 9/1998 | Tobita | G11C 11/4074 365/189.09 |
| 6,292,015 | B1 | * | 9/2001 | Ooishi | G11C 5/147 326/101 |
| 7,116,240 | B2 | * | 10/2006 | Hyde | G06K 19/0723 340/661 |
| 7,215,251 | B2 | * | 5/2007 | Hyde | G06K 19/0723 340/661 |
| 10,079,583 | B2 | * | 9/2018 | Chu | H03G 3/001 |
| 10,373,038 | B1 | * | 8/2019 | Stanford | G06K 7/10198 |
| 10,715,137 | B2 | * | 7/2020 | Chern | H03K 17/063 |

(Continued)

FOREIGN PATENT DOCUMENTS

JP 2010109340 5/2010

*Primary Examiner* — Daniel I Walsh
(74) *Attorney, Agent, or Firm* — JCIPRNET

(57) ABSTRACT

A flag holding circuit includes: a flag setting part connected to a voltage supply line and charging a capacitor according to an input signal; a flag determination part outputting an output signal based on a charging voltage of the capacitor; and a discharging part discharging the capacitor. The flag setting part includes: a switch having a first terminal connected to a connection line between the flag determination part and the discharging part and a second terminal connected to the voltage supply line or a grounding line according to a signal level of the input signal, and connecting or disconnecting the voltage supply line or the grounding line with the connection line according to a leakage control signal; and a switch control part, generating the leakage control signal whose signal level changes to be greater than a power supply voltage according to a clock signal and supplying it to the switch.

8 Claims, 11 Drawing Sheets

(56) References Cited

U.S. PATENT DOCUMENTS

| | | | | |
|---|---|---|---|---|
| 10,740,574 B1* | 8/2020 | Stanford | G06K 7/10217 |
| 10,938,443 B2* | 3/2021 | Kuo | H03H 7/0153 |
| 2001/0054881 A1* | 12/2001 | Watanabe | H02M 3/33576 | 320/166 |
| 2003/0156440 A1* | 8/2003 | Hata | G11C 15/00 | 365/49.17 |
| 2005/0237844 A1* | 10/2005 | Hyde | G06K 19/0723 | 365/228 |
| 2008/0180219 A1* | 7/2008 | Fischer | G06K 19/0723 | 340/10.1 |
| 2009/0066483 A1* | 3/2009 | Naura | G06K 19/0723 | 340/10.51 |
| 2009/0085516 A1* | 4/2009 | Emori | B60L 3/0046 | 320/118 |
| 2010/0085190 A1* | 4/2010 | Sueoka | H04Q 9/00 | 340/572.7 |
| 2010/0181384 A1* | 7/2010 | Matsuzaki | G11C 11/412 | 235/492 |
| 2010/0238000 A1* | 9/2010 | Hung | G06K 19/07749 | 340/10.4 |
| 2011/0102049 A1* | 5/2011 | Conte | H03F 3/347 | 327/307 |
| 2011/0102058 A1* | 5/2011 | Conte | H03F 3/45183 | 327/512 |
| 2012/0025769 A1* | 2/2012 | Kikuchi | B60L 3/0046 | 320/118 |
| 2012/0133491 A1* | 5/2012 | Yamashita | G06K 19/0723 | 340/10.51 |
| 2013/0186959 A1* | 7/2013 | Smith | H03K 3/0233 | 235/492 |
| 2013/0245869 A1* | 9/2013 | Nishida | B60L 15/20 | 701/22 |
| 2014/0028352 A1* | 1/2014 | Chung | H03K 3/012 | 327/77 |
| 2015/0222229 A1* | 8/2015 | Chen | H03B 5/32 | 331/116 R |
| 2019/0362207 A1* | 11/2019 | Yotsuji | G06K 19/0709 |
| 2019/0362208 A1* | 11/2019 | Yotsuji | H02J 7/0068 |

* cited by examiner

FLAG HOLDING CIRCUIT AND FLAG HOLDING METHOD

CROSS-REFERENCE TO RELATED APPLICATION

This application claims the priority benefit of Japan Application No. 2018-099622, filed on May 24, 2018. The entirety of the above-mentioned patent application is hereby incorporated by reference herein and made a part of this specification.

BACKGROUND

Technical Field

The disclosure relates to a flag holding circuit and a flag holding method for holding a flag in an RFID tag.

Related Art

In recent years, attention has been paid to radio frequency identification (RFID) technology which uses short distance wireless communication to acquire information from a tag with information such as an identification (ID) or the like embedded therein. An RFID wireless communication system is composed of a tag with information such as an ID or the like embedded therein, and a reader/writer reading and writing the information from and to the tag in a non-contact manner using electric waves. An RFID wireless communication system (hereinafter referred to as passive RFID) using a passive tag without its own power supply is composed of a tag, and a reader/writer supplying power to the tag and reading and writing information from and to the tag in a non-contact manner using electric waves.

In the passive RFID, a persistence time for holding a flag including information of "0" and "1" in a tag for a certain period is provided (e.g., Japanese Laid-open No. 2010-109340 (Patent Document 1)). For example, the EPC™ global standard for the electronic product code (EPC) stipulates that in sessions S2, S3 and SL, a flag is held for more than 2 seconds after the power supply from the reader/writer to the tag is lost.

In a passive RFID tag, by turning on or off a transistor provided in a flag setting part, a capacitor is charged and a flag is set. In order to turn on this transistor, a maximum value of a source-drain voltage must be smaller than a maximum value of a gate voltage. For that reason, a power supply voltage VDD is applied to a gate of the transistor, and a reference voltage VREF lower than the power supply voltage VDD is applied to a source of the transistor.

However, in order to generate the reference voltage VREF lower than the power supply voltage VDD, a regulator for generating the reference voltage VREF from the power supply voltage VDD is separately provided. The whole RFID tag circuit needs to operate with power picked up from the electric waves received from the reader/writer, and operating power allocated to the regulator is limited. When it is attempted to reduce the operating current of the regulator as much as possible and divide the reference voltage VREF from the power supply voltage VDD, there is a problem that many high resistances are used and chip area increases (i.e., chip cost increases).

SUMMARY

A flag holding circuit according to the disclosure is mounted on a radio frequency identification (RFID) tag circuit that receives power supply by means of electric waves from a reader/writer device, and transmits and receives information to and from the reader/writer device by short distance wireless communication, and configured to receive setting of a flag having a value of 0 or 1 used for transmitting and receiving the information and hold the flag, wherein the flag holding circuit includes: a capacitor; a flag setting part, connected to a voltage supply line supplying a power supply voltage based on the power supply from the reader/writer device, receiving supply of an input signal and charging the capacitor according to the input signal; a flag determination part, outputting an output signal representing 0 or 1 based on a charging voltage of the capacitor; and a discharging part discharging the capacitor, wherein the capacitor has one terminal connected to a connection line connecting the flag determination part and the discharging part and the other terminal grounded, wherein the flag setting part includes: a leakage suppression switch, having a first terminal connected to the connection line and a second terminal connected to the voltage supply line or a grounding line according to a signal level of the input signal, and connecting or disconnecting the voltage supply line or the grounding line to or from the connection line according to a leakage control signal supplied to a control terminal; and a leakage suppression switch control part, receiving supply of a clock signal, generating the leakage control signal whose signal level changes to a value greater than the power supply voltage according to the clock signal and supplying the leakage control signal to the control terminal of the leakage suppression switch.

In addition, a semiconductor circuit according to the disclosure includes: a flag setting part, connected to a power supply voltage and a first node, supplying the power supply voltage to the first node or cutting off the supply of the power supply voltage according to an input signal; a capacitor, connected to the first node and charged with the power supply voltage; a flag determination part, connected to the first node and determining a flag based on a charging voltage of the capacitor; and a discharging part, connected to the first node and discharging the capacitor, wherein the flag setting part includes: a leakage suppression switch, receiving supply of the input signal, connected to a voltage supply line or a grounding line according to a signal level of the input signal, and connecting or disconnecting the voltage supply line or the grounding line to or from the first node according to a leakage control signal supplied to a control terminal; and a leakage suppression switch control part, receiving supply of a clock signal, generating the leakage control signal whose signal level changes to a value greater than the power supply voltage according to the clock signal and supplying the leakage control signal to the control terminal of the leakage suppression switch.

In addition, a flag holding method according to the disclosure includes the following steps: receiving power supply from the reader/writer device; receiving the supply of the input signal and the clock signal; charging the capacitor according to the input signal; outputting an output signal representing 0 or 1 based on a charging voltage of the capacitor; and discharging the capacitor, wherein the step of charging the capacitor according to the input signal includes the following steps: determining whether or not the voltage of the connection line exceeds the predetermined threshold; and if it is determined that the voltage of the connection line is equal to or lower than the predetermined threshold, causing the leakage suppression switch control part to supply the leakage control signal to the control terminal of the leakage suppression switch, and if it is determined that the voltage of the connection line exceeds the predetermined threshold, causing the leakage suppression switch control part to stop supplying the leakage control signal to the control terminal of the leakage suppression switch.

DESCRIPTION OF THE EMBODIMENTS

Figure 1:
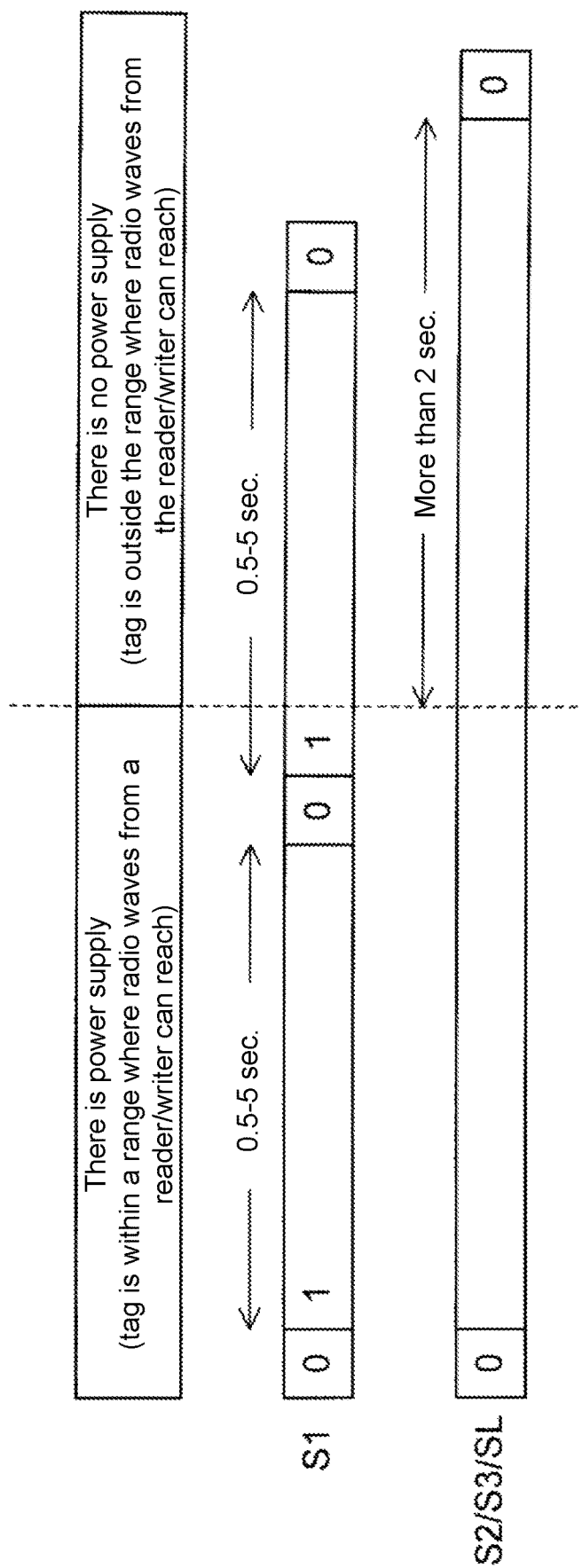
FIG. 1 schematically illustrates flag holding periods for each session.

The disclosure provides an RFID flag holding circuit capable of, while suppressing an increase in circuit scale, holding a flag for a predetermined period even after power supply is lost.

According to the flag holding circuit according to the disclosure, it is possible to hold a flag for a predetermined period even after power supply is lost, while suppressing an increase in circuit scale.

Embodiments of the disclosure are explained in detail below. Moreover, in the following explanations for each embodiment and the accompany drawings, substantially the same or equivalent parts are denoted by the same reference numerals.

Embodiment 1

A flag holding circuit 100 of the present embodiment is mounted on a radio frequency identification (RFID) tag circuit. The tag circuit receives power supply from a reader/writer via short distance wireless communication. Accordingly, the power supply is performed only when the tag circuit is located within a predetermined range from the reader/writer and is stopped when the tag circuit is outside the predetermined range. In the following explanations, the case where there is power supply from the reader/writer is simply referred to as "there is power supply", and the case where there is no power supply from the reader/writer is simply referred to as "there is no power supply".

In addition, in the RFID tag circuit, a flag for inventory is set and held for a predetermined period in accordance with the EPC™ global standard for the electronic product code (EPC). A flag holding period is defined for each of sessions S0, S1, S2, S3 and SL.

FIG. 1 schematically illustrates the flag holding periods for each session regarding the sessions S1, S2, S3 and SL. Illustration of the session S0 is omitted herein.

In the session S0, if there is no power supply, the flag may not be held; if there is power supply, the flag is always held. In the session S1, when a flag "F" is set, the flag "1" is held for a predetermined period of 0.5 second to 5 seconds irrespective of the presence or absence of power supply. In contrast, in the sessions S2, S3 and SL, when the flag "F" is set, the flag "F" is held for a predetermined period of more than 2 seconds after power supply is lost.

The flag holding circuit 100 of the present embodiment is a circuit for setting and holding a flag in the sessions S2, S3 and SL.

Figure 2:
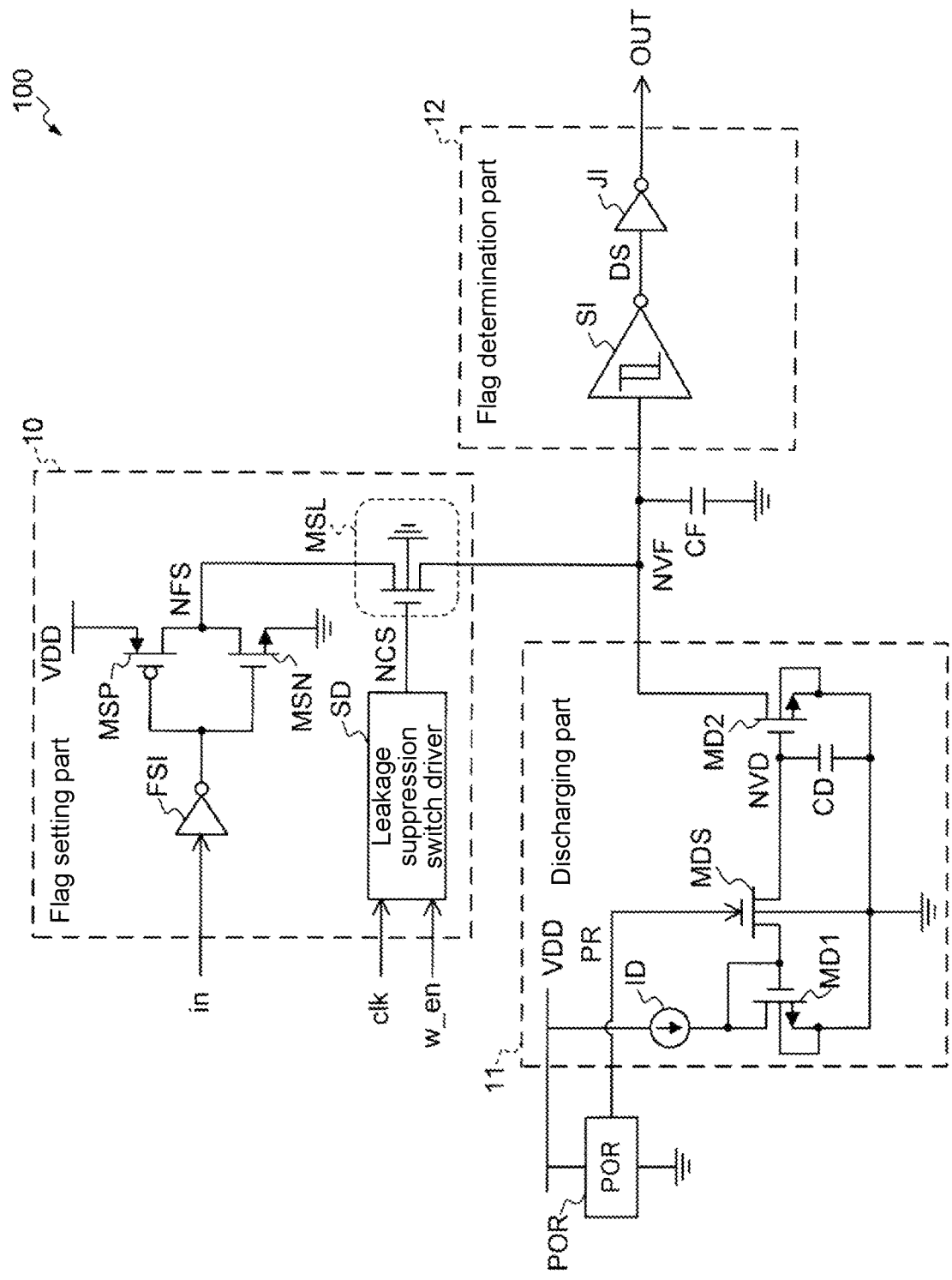
FIG. 2 is a circuit diagram illustrating a configuration of a flag holding circuit of the present embodiment.

FIG. 2 is a circuit diagram illustrating a configuration of the flag holding circuit 100 of the present embodiment. The flag holding circuit 100 has a capacitor CF, receives an input signal in, a clock signal clk and a writing control signal w_en supplied from a logic circuit (not shown) and charges and discharges the capacitor CF, and outputs a flag of "0" or "1". In addition, as described above, power is supplied to the flag holding circuit 100 when the tag circuit having the flag holding circuit 100 mounted therein is located within the predetermined range from the reader/writer.

The flag holding circuit 100 has the capacitor CF, a flag setting part 10, a discharging part 11 and a flag determination part 12. The capacitor CF has one terminal connected to a node NVF, which is a connection line between the discharging part 11 and the flag determination part 12, and has the other terminal grounded.

The flag setting part 10 includes an inverter FSI, a transistor MSP, a transistor MSN, a leakage suppression switch MSL, and a leakage suppression switch driver SD.

The inverter FSI receives the input signal in supplied from the logic circuit (not shown) and supplies a signal (hereinafter referred to as inverted input signal) obtained by inverting a logic level of the input signal in to a gate of each of the transistors MSP and MSN.

The transistor MSP is composed of a P-channel MOS transistor serving as a MOS transistor of a first conductivity type. A source of the transistor MSP is connected to a voltage supply line (power supply voltage VDD). The transistor MSN is composed of an N-channel MOS transistor serving as a MOS transistor of a second conductivity type opposite the first conductivity type. A source of the transistor MSN is grounded. Drains of the transistors MSP and MSN are connected to each other and connected to a node NFS. The transistors MSP and MSN are controlled to be on or off according to the inverted input signal supplied to the gates.

The leakage suppression switch MSL is composed of, for example, an N-channel MOS transistor. A drain of the leakage suppression switch MSL is connected to the drains of the transistors MSP and MSN via the node NFS. A source of the leakage suppression switch MSL is connected to the node NVF. A back gate of the leakage suppression switch MSL is grounded. To turn on the leakage suppression switch MSL, a voltage larger than the power supply voltage VDD, which is a maximum value of a voltage between the drain and the source, is supplied to a gate.

The leakage suppression switch driver SD is a control circuit controlling the gate of the leakage suppression switch MSL. The leakage suppression switch driver SD receives the clock signal clk and the writing control signal w_en supplied from the logic circuit (not shown), generates a leakage control signal NCS and supplies it to the gate of the leakage suppression switch MSL.

Figure 3:
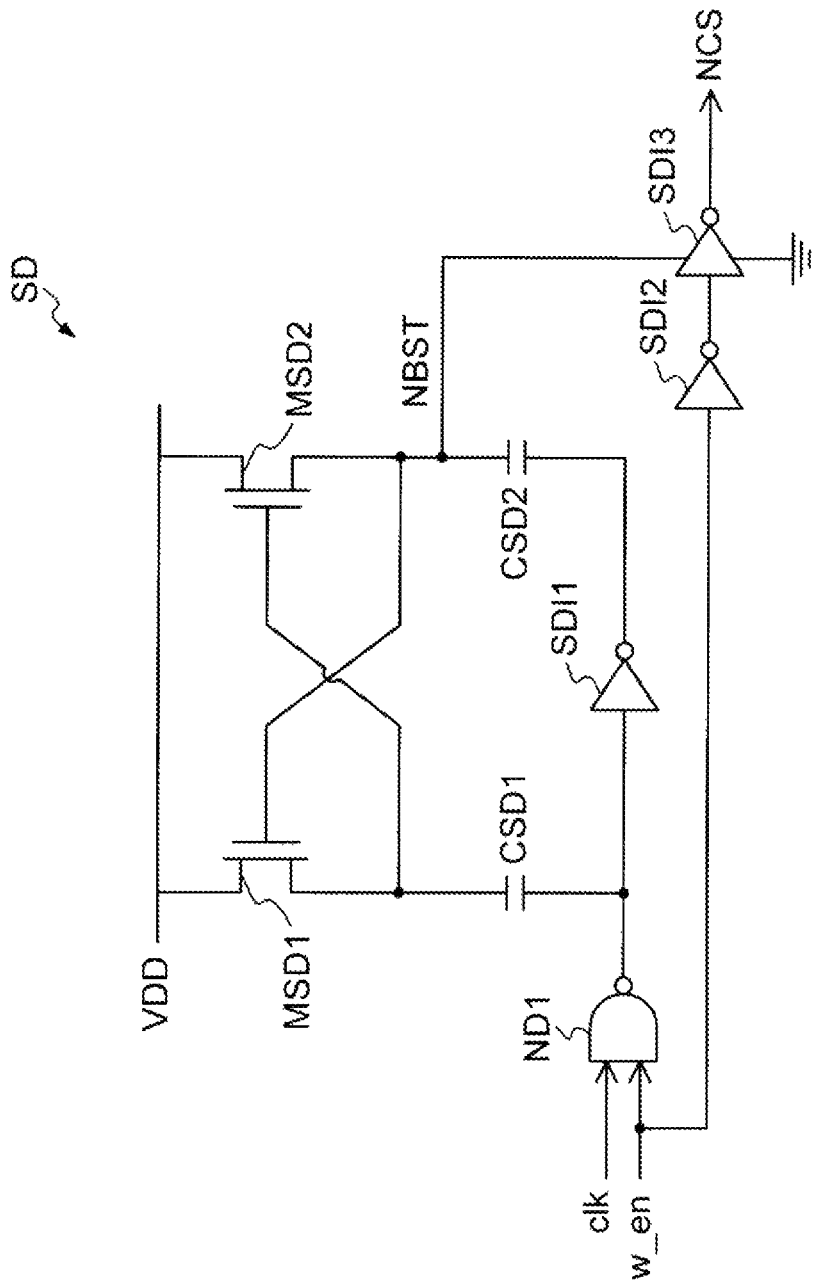
FIG. 3 is a circuit diagram illustrating a configuration of a leakage suppression switch driver.

FIG. 3 is a circuit diagram illustrating a configuration of the leakage suppression switch driver SD. The leakage suppression switch driver SD includes, for example, a transistor MSD1, a transistor MSD2, a capacitor CSD1, a capacitor CSD2, a NAND gate ND1, an inverter SDI1, an inverter SDI2 and an inverter SDI3.

The transistors MSD1 and MSD2 are formed of, for example, N-channel MOS transistors. Sources of the transistors MSD1 and MSD2 are connected to the voltage supply line (power supply voltage VDD). A gate of the transistor MSD1 is connected to a node NBST. A drain of the transistor MSD2 is connected to the node NBST.

One terminal of the capacitor CSD1 is connected to a drain of the transistor MSD1 and a gate of the transistor MSD2. The other terminal of the capacitor CSD1 is connected to an output terminal of the NAND gate ND1 and an input terminal of the inverter SDI1.

One terminal of the capacitor CSD2 is connected to the gate of the transistor MSD1 and the drain of the transistor MSD2 via the node NBST. The other terminal of the capacitor CSD2 is connected to an output terminal of the inverter SDI1.

The NAND gate ND1 receives inputs of the clock signal clk and the writing control signal w_en and outputs a NAND signal of the clock signal clk and the writing control signal w_en.

The inverter SDI1 has the input terminal connected to the output terminal of the NAND gate ND1 and the other terminal of the capacitor CSD1. The inverter SDI1 inverts a signal supplied to the input terminal and supplies it to the capacitor CSD2.

The inverter SDI2 receives input of the writing control signal w_en and outputs a signal obtained by inverting a logic level of the writing control signal w_en.

The inverter SDI3 receives input of an output signal (i.e., the signal obtained by inverting the logic level of the writing control signal w_en) from the inverter SDI2, and outputs the signal obtained by inverting the logic level as the leakage control signal NCS. A positive power supply terminal of the inverter SDI3 is connected to the node NBST and a negative power supply terminal of the inverter SDI3 is grounded. Accordingly, the leakage control signal NCS is a signal having a signal level corresponding to a potential of the node NBST.

Figure 4:
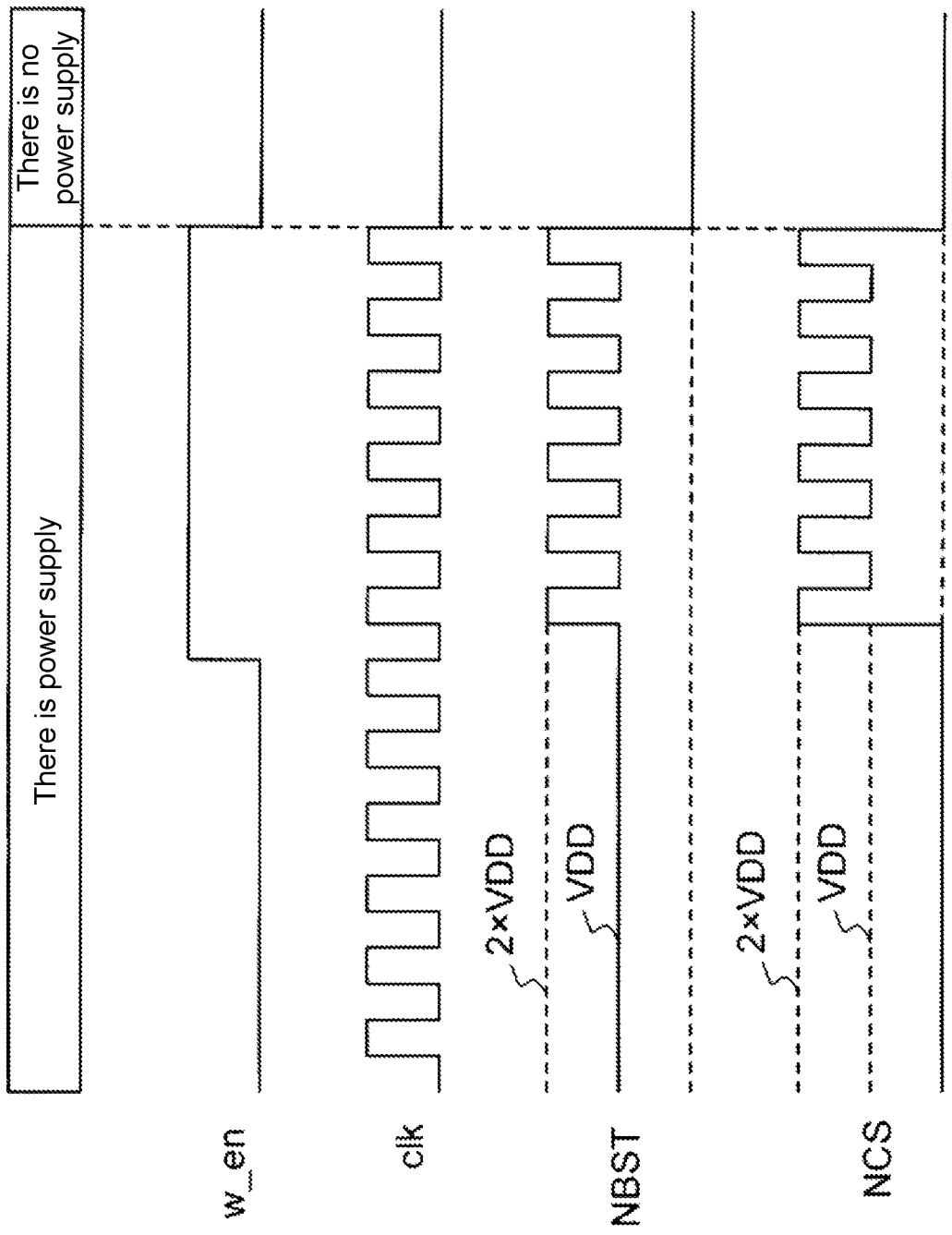
FIG. 4 is a time chart illustrating operation of a leakage suppression switch driver.

FIG. 4 is a time chart illustrating operation of the leakage suppression switch driver SD. If there is power supply, the clock signal clk is supplied to the NAND gate ND1. The writing control signal w_en is a signal whose signal level changes to logic levels "0" and "1", and is a signal triggering control of the leakage suppression switch MSL by the leakage suppression switch driver SD.

During a period in which the writing control signal w_en has the logic level "0" (i.e., off), the capacitor CSD1 and the capacitor CSD2 are charged with the power supply voltage VDD. Accordingly, the potential of the node NBST reaches a level of the power supply voltage VDD. The leakage control signal NCS output from the inverter SDI3 has the logic level "0", similarly to the writing control signal w_en, and becomes a signal level of a ground potential.

When the writing control signal w_en changes to the logic level "1" (i.e., on), the potential of the node NBST constitutes a potential obtained by adding, to the potential at the level of the power supply voltage VDD, a signal changing to the level of the power supply voltage VDD in synchronization with the clock signal clk. That is, the potential level of the node NBST changes between VDD and 2×VDD at timing synchronized with the clock signal clk.

The leakage control signal NCS output from the inverter SDI3 is a signal whose signal level changes to VDD and 2×VDD in synchronization with the clock signal clk. Accordingly, while the writing control signal w_en is on, the leakage control signal NCS whose signal level is at most 2×VDD is supplied to the gate of the leakage suppression switch MSL.

In this way, the flag setting part 10 is connected to a power supply (the power supply voltage VDD) and the note NVF serving as the first node, and supplies the power supply voltage VDD to the node NVF, or cuts off the power supply, based on the input signal in.

Referring again to FIG. 2, the discharging part 11 includes a current source ID, a capacitor CD, a transistor MD1, a transistor MD2 and a transistor MDS.

One terminal of the current source ID is connected to the voltage supply line. The capacitor CD has one terminal connected to a node NVD and the other terminal grounded.

The transistor MD1 is formed of an N-channel MOS transistor. A gate (control terminal) and a drain (second terminal) of the transistor MD1 are connected to the other terminal of the current source ID. A source (first terminal) and a back gate of the transistor MD1 are grounded. The transistor MD1 converts a current flowed by the current source ID into a DC voltage.

The transistor MD2 is a transconductance element that discharges the capacitor CF via the node NVF. The transistor MD2 is formed of, for example, an N-channel MOS transistor. A source (first output terminal) and a back gate of the transistor MD2 are grounded. A drain (second output terminal) of the transistor MD2 is connected to the node NVF. A gate (control input terminal) of the transistor MD2 is connected to the node NVD.

The transistor MDS is a control switch controlling an input voltage of the transistor MD2. The transistor MDS is formed of, for example, an N-channel MOS transistor. A source (first terminal) of the transistor MDS is connected to the node NVD. A drain (second terminal) of the transistor MDS is connected to the other terminal of the current source ID, and the gate and the drain of the transistor MD1. That is, the drain of the transistor MDS is connected to a node of a DC voltage obtained by converting the current from the current source ID by the transistor MDS.

A power-on reset signal PR is supplied from a power-on reset part POR to a gate of the transistor MDS. If there is power supply from the reader/writer to the tag circuit, the power-on reset part POR applies a signal at the level corresponding to the power supply voltage VDD as the power-on reset signal PR to the gate of the transistor MDS. If there is no power supply from the reader/writer to the tag circuit, the power-on reset part POR applies a ground-level signal as the power-on reset signal PR to the gate of the transistor MDS. Accordingly, if there is power supply, the transistor MDS is turned on; if there is no power supply, the transistor MDS is turned off.

The discharging part 11 discharges the capacitor CF according to a drain current of the transistor MD2. At that time, since a signal level of the power-on reset signal POR varies depending on the presence or absence of power supply and the on/off state of the transistor MDS also changes, the drain current of the transistor MD2 also varies depending on the presence or absence of power supply. In addition, the drain current of the transistor MD2 is affected by a reverse leakage current in a parasitic diode of the transistor MDS and a parasitic diode of the transistor MD2.

Figure 5:
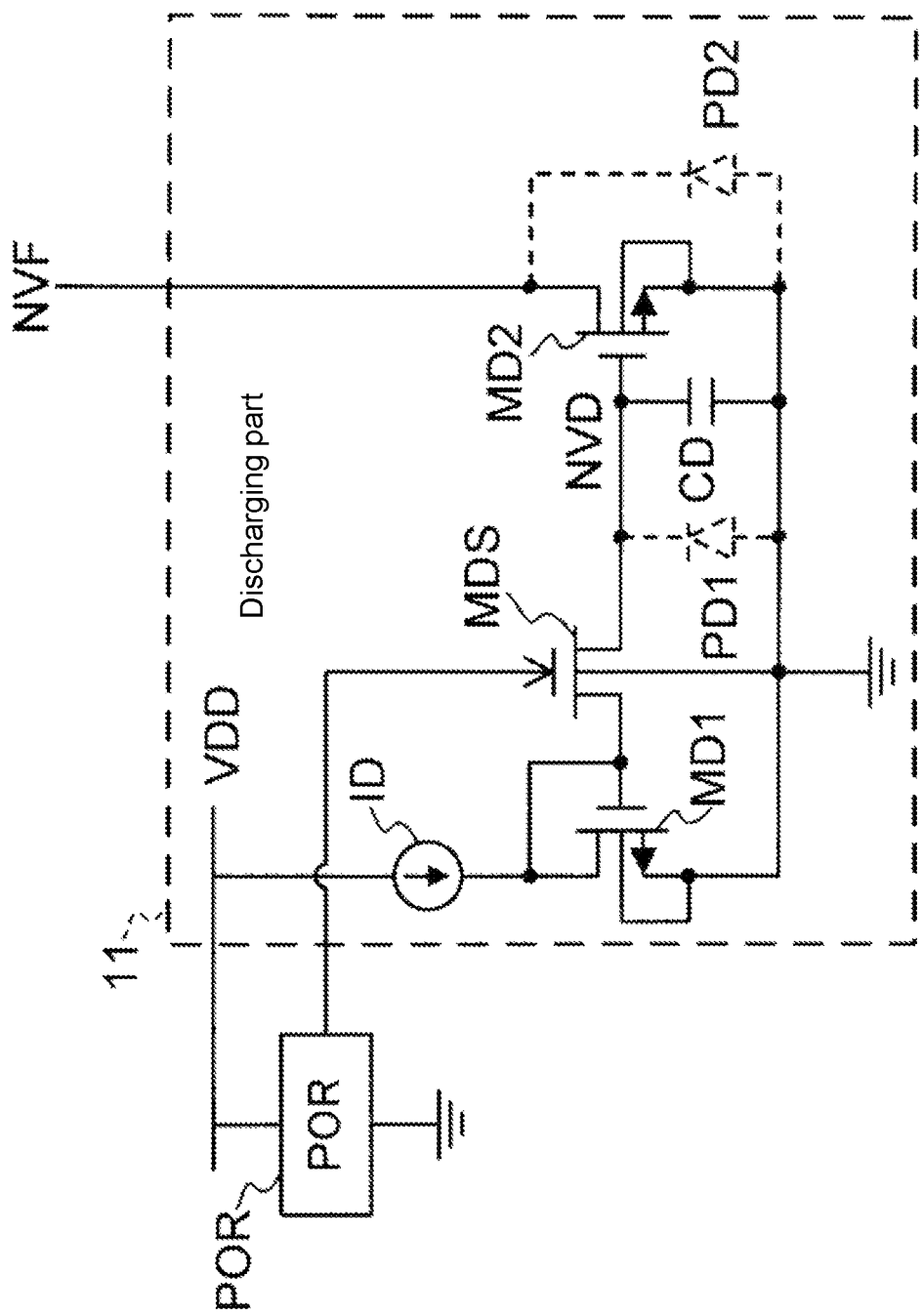
FIG. 5 schematically illustrates a parasitic diode generated in a discharging part.

FIG. 5 schematically illustrates a parasitic diode PD1 of the transistor MDS and a parasitic diode PD2 of the transistor MD2.

The parasitic diode PD1 is generated between the node NVD and the ground so as to be parallel to the capacitor CD. In the case where the transistor MDS is off, due to the reverse leakage current generated in the parasitic diode PD1, the capacitor CD is gradually discharged and a potential of the node NVD gradually decreases.

Figure 6:
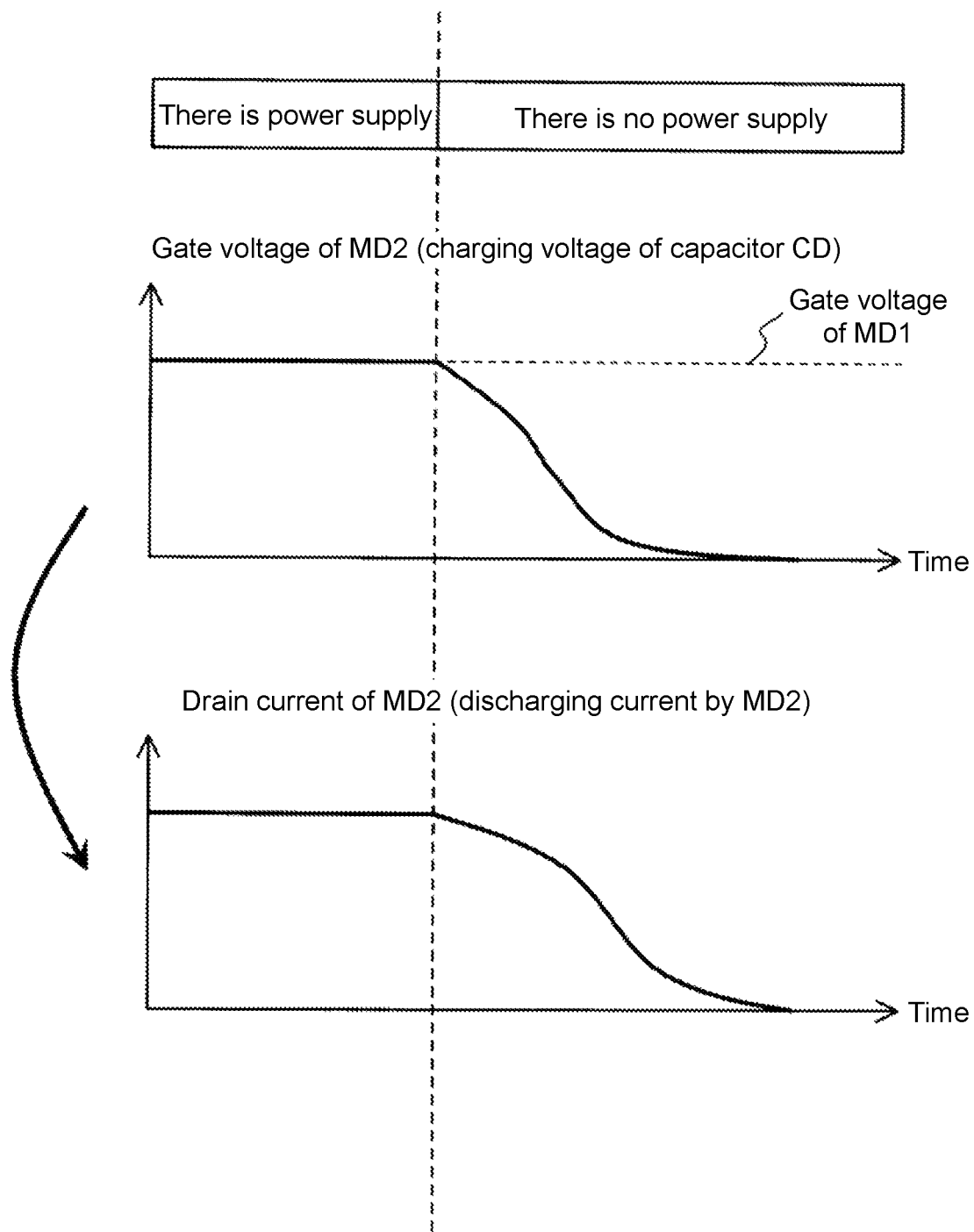
FIG. 6 illustrates changes in input voltage and current of a transistor MD2 over time according to the presence or absence of power supply.

FIG. 6 illustrates changes in gate voltage and drain current of the transistor MD2 over time in the cases where there is power supply and where there is no power supply.

In the case where there is power supply, a gate voltage of the transistor MD2 becomes constant (a value equal to a gate voltage of the transistor MD1 determined according to a current value of the current source ID). Accordingly, a drain current of the transistor MD2 also becomes constant.

On the other hand, in the case where there is no power supply, the gate voltage of the transistor MD2 gradually decreases due to the discharge of the capacitor CD caused by the reverse leakage current of the parasitic diode PD1 of the transistor MDS. Accordingly, the drain current of the transistor MD2 also gradually decreases.

Referring again to FIG. 5, the parasitic diode PD2 is generated between the node NVF and the ground so as to be parallel to the transistor MD2. A reverse leakage current generated in the parasitic diode PD2 constitutes a discharging current of the capacitor CF together with the drain current of the transistor MD2. Accordingly, even if the power supply is lost and the gate voltage and the drain current of the transistor MD2 become substantially zero, because of the reverse leakage current in the parasitic diode PD2, the discharging current of the capacitor CF does not become zero.

In addition, the discharging current of the capacitor CF is affected by, in addition to the drain current of the transistor MD2 and the parasitic diode of the transistor MD2, a parasitic diode of the leakage suppression switch MSL of the flag setting part 10.

Figure 7:
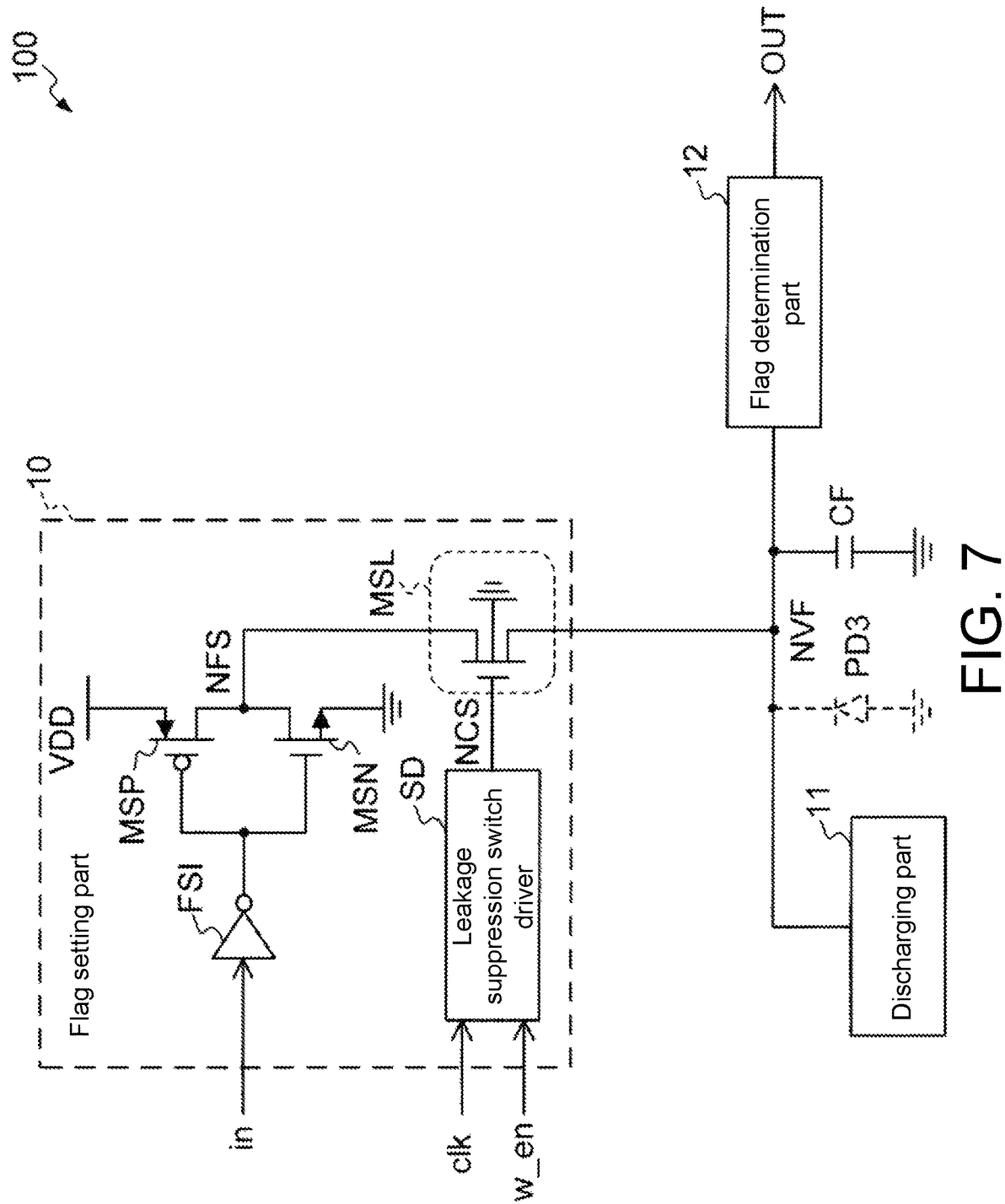
FIG. 7 schematically illustrates a parasitic diode of a leakage suppression switch MSL.

FIG. 7 schematically illustrates a parasitic diode PD3 of the leakage suppression switch MSL. The parasitic diode PD3 is generated between the node NVF and the ground so as to be parallel to the capacitor CF.

A reverse leakage current generated in the parasitic diode PD3 constitutes a discharging current of the capacitor CF together with a discharging current generated by the discharging part 11. Accordingly, even if the discharging current generated by the discharging part 11 disappears, because of the reverse leak current in the parasitic diode PD3, the discharging current of the capacitor CF does not become zero.

Referring again to FIG. 2, the flag determination part 12 includes a Schmitt inverter SI and an inverter JI. The Schmitt inverter SI supplies a determination signal DS at an L level or an H level to the inverter JI according to a voltage level of the node NVF. The inverter JI outputs, as an output signal OUT, a signal obtained by inverting the determination signal DS.

The Schmitt inverter SI is a Schmitt trigger inverter having hysteresis characteristics in input and output. The Schmitt inverter SI has an input threshold voltage Vth_LH measured when an output voltage changes from the L (low) level to the H (high) level, and an input threshold voltage Vth_HL measured when the output voltage changes from the H level to the L level (Vth_HL>Vth_LH). Hence, even if the node NVF is an intermediate voltage between the power supply voltage VDD and the ground, through current can be avoided and the output can be binarized.

A voltage of the node NVF at which the output signal OUT changes from the H level to the L level, i.e., the determination signal DS changes from the L level to the H level, constitutes a determination threshold voltage Vth_jdg for flag determination. Accordingly, in the case where there is power supply and the voltage of the node NVF is equal to or higher than the determination threshold voltage Vth_jdg, the determination signal DS is at the L level and the output signal OUT is at the H level. In addition, in the case where there is power supply and the voltage of the node NVF is lower than the determination threshold voltage Vth_jdg, the determination signal DS is at the H level and the output signal OUT is at the L level. On the other hand, in the case where there is no power supply, the output signal OUT is at the L level irrespective of the magnitude of the voltage of the node NVF and the determination threshold voltage Vth_jdg.

Figure 8:
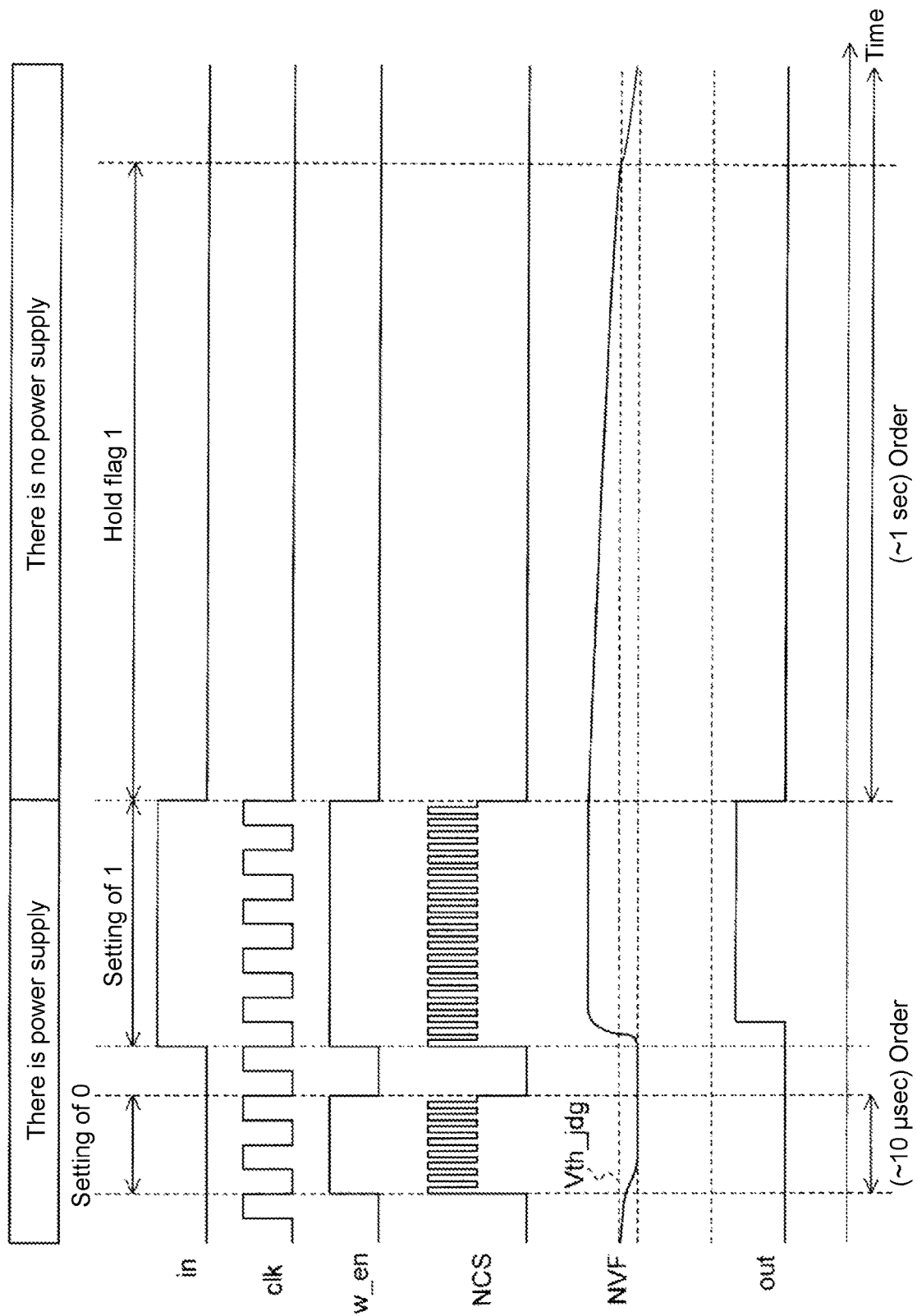
FIG. 8 is a time chart illustrating changes in input/output signals and potential of internal nodes in operation of a flag holding circuit over time.

Next, operation of the flag holding circuit 100 of the present embodiment is explained with reference to a time chart in FIG. 8. Although a period during which there is power supply is much shorter than a period during which there is no power supply (e.g., the period during which there is power supply is on the order of 10 μsec and the period during which there is no power supply is on the order of 1 sec), herein, the two periods are schematically shown to have close lengths.

First of all, the flag holding circuit 100 writes a flag "0" in a state where there is power supply. The input signal in at the L level that represents "0" is supplied to the flag setting part 10. A signal at the H level obtained by inverting the logic level of the input signal in is supplied to the gates of the transistors MSP and MSN, and the transistor MSP is turned off and the transistor MSN is turned on. Accordingly, the node NFS has a potential near ground.

The clock signal clk and the writing control signal w_en at the H level are supplied to the leakage suppression switch driver SD. The leakage suppression switch driver SD supplies the leakage control signal NCS whose signal level is at most twice the power supply voltage VDD to the gate of the leakage suppression switch MSL, turning on the leakage suppression switch MSL.

When the leakage suppression switch MSL is turned on, the capacitor CF is discharged, and the potential of the node NFS is in the vicinity of the ground potential. Since the potential of the node NVF is near ground, the discharging current generated by the discharging part 11 becomes zero. Also, since the potential of the node NVF is near ground, the flag determination part 12 outputs the output signal OUT at the L level (ground level).

Next, the flag holding circuit 100 writes a flag "1" in the state where there is power supply. The input signal in at the H level that represents "1" is supplied to the flag setting part 10. A signal at the L level obtained by inverting the logic level of the input signal in is supplied to the gates of the transistors MSP and MSN, and the transistor MSP is turned on and the transistor MSN is turned off. Accordingly, the node NFS has a potential near the power supply voltage VDD.

The clock signal clk and the writing control signal w_en at the H level are supplied to the leakage suppression switch driver SD. In response, the leakage suppression switch driver SD supplies the leakage control signal NCS whose signal level is at most twice the power supply voltage VDD to the gate of the leakage suppression switch MSL, controlling the leakage suppression switch MSL to be on.

When the leakage suppression switch MSL is turned on, the capacitor CF is charged, and the potential of the node NFS is near the power supply voltage VDD. Although the discharging part 11 causes a constant discharging current to flow to the ground, since the charging of the capacitor CF by the flag setting part 10 is larger, the node NVF is maintained near the power supply voltage VDD. Since the node NVF is near the power supply voltage VDD, the flag determination part 12 outputs the output signal OUT at the H level.

Next, the flag holding circuit 100 holds the flag "1" in a state where there is no power supply.

When the supply of electric waves from the reader/writer is interrupted and the power supply from the reader/writer to the tag circuit is lost, the writing control signal w_en at the L level is supplied to the leakage suppression switch driver SD. In response, the leakage suppression switch driver SD supplies the leakage control signal NCS at the L level to the gate of the leakage suppression switch MSL. Accordingly, the leak suppression control switch MSL is turned off.

After the flag "1" is set, since the capacitor CF is charged with a voltage near the power supply voltage VDD, the potential of the node NFS is near the power supply voltage VDD. At this moment, as shown in FIG. 6, the drain current of the transistor MD2 gradually decreases, which gradually discharges the capacitor CF along with the reverse leakage current generated by the parasitic diodes (PD2 and PD3). Accordingly, the potential of the node NVF gradually decreases.

The flag "1" is held until a moment at which the node NVF falls below the determination threshold voltage Vth_jdg for flag determination. The time from the moment at which the power supply is lost to the moment at which the node NVF falls below the determination threshold voltage Vth_jdg for flag determination is the flag holding period.

As described above, each part of the flag holding circuit 100 of the present embodiment operates based on the power supply voltage VDD and has a single power supply system. Particularly, in the flag setting part 10, while operating based on the power supply voltage VDD, the leakage suppression switch driver SD generates the leakage control signal NCS having the signal level twice the power supply voltage VDD as a maximum value, and supplies the leakage control signal NCS to the gate of the leakage suppression switch MSL. In order to turn on the leakage suppression switch MSL, the maximum value of the gate voltage is made to be greater than the maximum value of the source-drain voltage. However, according to the flag holding circuit 100 of the present embodiment, while the power supply voltage VDD is supplied to the drain of the leakage suppression switch MSL, the leakage control signal NCS having a signal level of 2×VDD can be supplied to the gate of the leakage suppression switch MSL.

Figure 9:
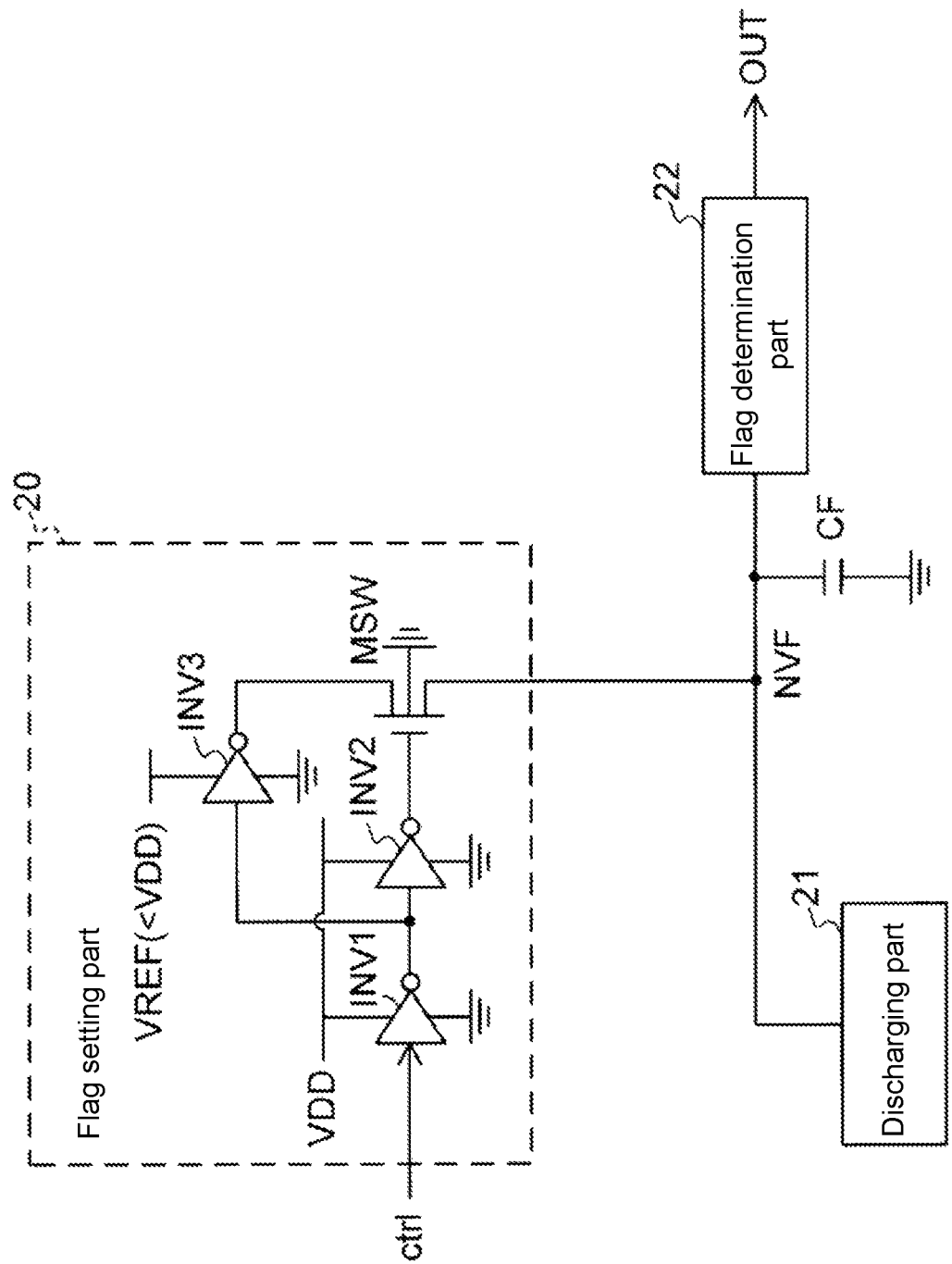
FIG. 9 is a circuit diagram illustrating a configuration of a flag holding circuit of a comparative example.

FIG. 9 is a circuit diagram illustrating a configuration of a flag holding circuit of a comparative example different from the flag holding circuit 100 of the present embodiment. The flag holding circuit of the comparative example has a flag setting part 20, a discharging part 21 and a flag determination part 22.

The flag setting part 20 receives supply of an input signal ctrl that is at the H level when the flag "1" is set. A signal obtained by setting the signal level of the input signal ctrl to the level of the power supply voltage VDD is applied to a gate of a leakage suppression switch MSW via inverters INV1 and INV2 using the power supply voltage VDD as an operating voltage. At that time, a signal obtained by setting the signal level of the input signal ctrl to a level of a reference voltage VREF smaller than the power supply voltage VDD is supplied to a drain of the leakage suppression switch MSW via an inverter INV3 using the reference voltage VREF as an operating voltage. By turning on the leakage suppression switch MSW, the capacitor CF is charged to the level of the reference voltage VREF.

In the flag holding circuit of the comparative example, a dedicated regulator for generating the reference voltage VREF smaller than the power supply voltage VDD is separately required. The whole RFID tag circuit needs to operate with power picked up from the electric waves received from the reader/writer, and operating power allocated to the regulator is limited. When it is attempted to reduce operating current of the regulator as much as possible and divide the reference voltage VREF from the power supply voltage VDD, many high resistances are used and chip area increases.

In contrast, in the flag holding circuit 100 of the present embodiment, by the leakage suppression switch driver SD generating the leakage control signal NCS having the signal level twice the power supply voltage VDD as the maximum value, a larger voltage than that supplied to the drain is supplied to the gate of the leakage suppression switch MSL. Therefore, the dedicated regulator for generating the reference voltage VREF is not needed.

The RFID tag circuit cannot known in advance when the supply of electric waves from the reader/writer is interrupted. In addition, since the RFID tag circuit needs to operate with limited electric power obtained by rectifying the electric waves from the reader/writer, low current operation is required. In the flag holding circuit 100 of the present embodiment, a flag can be held for a certain period or longer whenever the electric waves are interrupted. In addition, since there is no need to separately provide the dedicated regulator, it is possible to operate at low operating current and an increase in chip cost can be avoided.

Accordingly, according to the flag holding circuit 100 of the present embodiment, it is possible to hold a flag for a predetermined period (specifically, a period of more than 2 seconds) even after power supply is lost, while suppressing an increase in circuit scale.

Embodiment 2

Next, a flag holding circuit 200 of Embodiment 2 is explained. Like the flag holding circuit 100 of Embodiment 1, the flag holding circuit 200 of the present embodiment is a circuit mounted on an RFID tag circuit and setting and holding a flag in the sessions S2, S3 and SL in accordance with the EPC™ global standard for the EPC.

Figure 10:
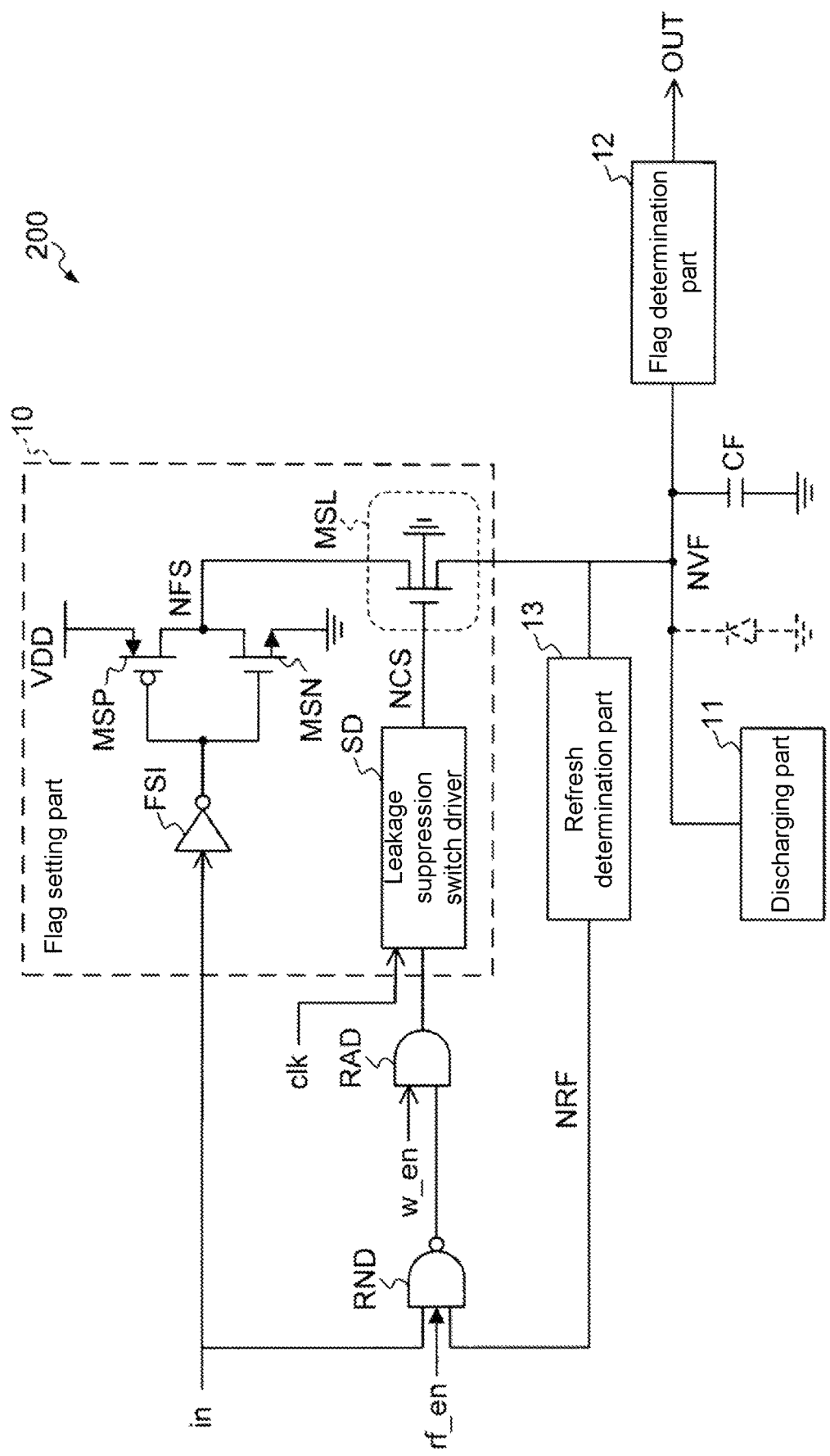
FIG. 10 is a circuit diagram illustrating a configuration of a flag holding circuit of Embodiment 2.

FIG. 10 is a circuit diagram illustrating a configuration of the flag holding circuit 200 of the present embodiment. The flag holding circuit 200 differs from the flag holding circuit 100 of Embodiment 1 in that it has a refresh determination part 13, a 3-input NAND gate RND and a 2-input AND gate RAD.

The refresh determination part 13 determines whether or not the potential of the node NVF exceeds a threshold voltage Vth_ref, and outputs a determination result. The refresh determination part 13 has an input terminal connected to the node NVF and an output terminal connected to one of input terminals of the NAND gate RND.

Figure 11A:
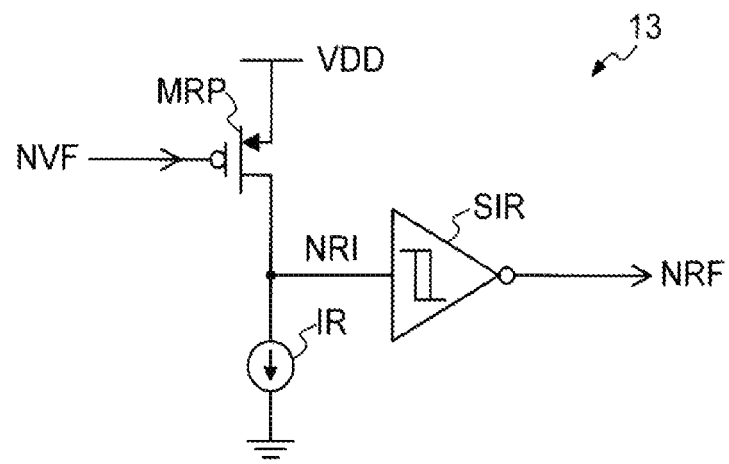
FIG. 11A is a circuit diagram illustrating a configuration of a refresh determination part.

FIG. 11A is a circuit diagram illustrating a configuration of the refresh determination part 13. The refresh determination part 13 includes a transistor MRP, a current source IR and a Schmitt inverter SIR.

The transistor MRP is formed of, for example, a P-channel MOS transistor. A source of the transistor MRP is connected to the voltage supply line (power supply voltage VDD), and a drain of the transistor MRP is connected to a node NRI. A gate of the transistor MRP is connected to the node NVF.

One terminal of the current source IR is connected to the node NRI and the drain of the transistor MRP. The other terminal of the current source IR is grounded. The current source IR has a function of limiting a current value of a current flowing between the source and the drain of the transistor MRP when the transistor MRP is on and preventing the flow of a large current.

The Schmitt inverter SIR is a Schmitt trigger inverter having hysteresis characteristics in input and output. The Schmitt inverter SIR has a threshold voltage when an input voltage changes from the L level to the H level and a threshold voltage when the input voltage changes from the H level to the L level. Hence, even if the node NRI is an intermediate voltage between the power supply voltage VDD and the ground, through current can be avoided and the output can be binarized.

Referring again to FIG. 10, if the potential of the node NVF (i.e., charging voltage of the capacitor CF) is higher than the threshold voltage Vth_ref, the refresh determination part 13 outputs an output signal NRF at the H level. On the other hand, if the potential of the node NVF is lower than the threshold voltage Vth_ref, the refresh determination part 13 outputs the output signal NRF at the L level.

The input signal in is supplied to a first input terminal of the NAND gate RND. A refresh control signal rf_en is supplied to a second input terminal of the NAND gate RND. The refresh control signal rf_en is a binary signal for controlling the operation of the leakage suppression switch driver SD and is supplied from a logic circuit (not shown). The output signal NRF of the refresh determination part 13 is supplied to a third input terminal of the NAND gate RND. If the signals supplied to the three input terminals are all at the H level, the NAND gate RND outputs a signal at the L level; if any of the signals is at the L level, the NAND gate RND outputs a signal at the H level.

The writing control signal w_en is supplied to a first input terminal of the AND gate RAD. A second input terminal of the AND gate RAD is connected to an output terminal of the NAND gate RND and receives supply of an output signal of the NAND gate RND. In the case where the writing control signal w_en and the output signal of the NAND gate RND are both at the H level, the AND gate RAD outputs a signal at the H level to an input terminal of the leakage suppression switch driver SD. In the case where either of the writing control signal w_en or the output signal of the NAND gate RND is at the L level, the AND gate RAD outputs a signal at the L level to the input terminal of the leakage suppression switch driver SD.

The NAND gate RND and the AND gate RAD have a function as an operation control part for controlling the operation of the leakage suppression switch driver SD according to the determination result of the refresh determination part 13. That is, in the case where the writing control signal w_en and the refresh control signal rf_en are both at the H level, when the NAND gate RND receives the output signal NRF at the L level supplied from the refresh determination part 13, the AND gate RAD supplies a signal at the H level to the input terminal of the leakage suppression switch driver SD. On the other hand, when the NAND gate RND receives the output signal NRF at the H level supplied from the refresh determination part 13, if the input signal in is at the H level, the AND gate RAD supplies a signal at the L level to the input terminal of the leakage suppression switch driver SD.

Next, operation of the flag holding circuit 200 of the present embodiment is explained.

First of all, the flag holding circuit 200 writes a flag "0" in the state where there is power supply. The input signal in at the L level that represents "0" is supplied to the flag setting part 10. A signal at the H level obtained by inverting the logic level of the input signal in is supplied to the gates of the transistors MSP and MSN, and the transistor MSP is turned off and the transistor MSN is turned on. Accordingly, the node NFS has a potential near ground.

The input signal in at the L level is supplied to the first input terminal of the NAND gate RND. Accordingly, the output signal of the NAND gate RND is at the H level.

The AND gate RAD supplies an output signal having the same logic as the writing control signal w_en to the leakage suppression switch driver SD. Since the signal level of the writing control signal w_en is H level during writing of the flag "0", the writing control signal w_en at the H level is supplied to the leakage suppression switch driver SD. The leakage suppression switch driver SD supplies the leakage control signal NCS whose signal level is at most twice the power supply voltage VDD to the gate of the leakage suppression switch MSL, turning on the leakage suppression switch MSL.

When the leakage suppression switch MSL is turned on, the capacitor CF is discharged, and the potential of the node NFS is near ground. Since the potential of the node NVF is near ground, the discharging current generated by the discharging part 11 becomes zero. Also, since the potential of the node NVF is near ground, the flag determination part 12 outputs the output signal OUT at the L level (ground level).

Next, the flag holding circuit 200 writes a flag "1" in the state where there is power supply. The input signal in at the H level that represents "1" is supplied to the flag setting part 10. In addition, at the start of writing, the refresh control signal rf_en at the L level is supplied from the logic circuit (not shown) to the flag setting part 10.

A signal at the L level obtained by inverting the logic level of the input signal in is supplied to the gates of the transistors MSP and MSN, and the transistor MSP is turned on and the transistor MSN is turned off. Accordingly, the node NFS has a potential near the power supply voltage VDD.

The refresh control signal rf_en at the L level is supplied to the second input terminal of the NAND gate RND. Accordingly, the output signal of the NAND gate RND is at the H level.

The AND gate RAD supplies an output signal having the same logic as the writing control signal w_en to the leakage suppression switch driver SD. Since the signal level of the writing control signal w_en is H level during writing of a flag, the writing control signal w_en at the H level is supplied to the leakage suppression switch driver SD. In response, the leakage suppression switch driver SD supplies the leakage control signal NCS whose signal level is at most twice the power supply voltage VDD to the gate of the leakage suppression switch MSL, controlling the leakage suppression switch MSL to be on.

When the leakage suppression switch MSL is turned on, the capacitor CF is charged, and the potential of the node NFS is near the power supply voltage VDD. Although the discharging part 11 causes a constant discharging current to flow to the ground, since the charging of the capacitor CF by the flag setting part 10 is larger, the potential of the node NVF is maintained to be near the power supply voltage VDD. Since the potential of the node NVF is near the power supply voltage VDD, the flag determination part 12 outputs the output signal OUT at the H level.

When a period of time for charging the node NVF (i.e., charging voltage of the capacitor CF) to be near the power supply voltage VDD has elapsed since the start of writing, the logic circuit (not shown) switches the signal level of the refresh control signal rf_en to H level.

A state where the input signal in at the H level is supplied to the first input terminal of the NAND gate RND and the refresh control signal rf_en at the H level is supplied to the second input terminal of the NAND gate RND is achieved. The NAND gate RND outputs a signal obtained by inverting a logic of the output signal NRF of the refresh determination part 13.

In the case where the potential of the node NVF is higher than the threshold voltage Vth_ref, the refresh determination part 13 outputs the output signal NRF at the H level; in the case where the potential of the node NVF is lower than the threshold voltage Vth_ref, the refresh determination part 13 outputs the output signal NRF at the L level. Accordingly, in the case where the potential of the node NVF is higher than the threshold voltage Vth_ref, the output signal of the NAND gate RND is at the L level, and the output signal of the AND gate RAD is at the L level. On the other hand, in the case where the potential of the node NVF is lower than the threshold voltage Vth_ref, the output signal of the NAND gate RND is at the H level, and the output signal of the AND gate RAD is at the H level.

In this way, when the potential of the node NVF (i.e., charging voltage of the capacitor CF) is higher than the threshold voltage Vth_ref, the output signal of the AND gate RAD is at the L level, and a signal at the L level is input to the leakage suppression switch driver SD. Accordingly, the leakage suppression switch driver SD generates the leakage control signal NCS at the L level and supplies it to the gate of the leakage suppression switch MSL. Accordingly, the leakage suppression switch MSL is turned off, and therefore the charging operation on the capacitor CF is stopped.

After that, due to the stop of the charging operation, the discharging operation becomes superior, and when the potential of the node NVF becomes lower than the threshold voltage Vth_ref, the output signal of the AND gate RAD is at the H level, and a signal at the H level is input to the leakage suppression switch driver SD. Accordingly, the leakage suppression switch driver SD generates the leakage control signal NCS at the H level and supplies it to the gate of the leakage suppression switch MSL. Accordingly, the leakage suppression switch MSL is turned on, and therefore charging of the capacitor CF is performed again.

As described above, in the flag holding circuit 200 of the present embodiment, after a lapse of a predetermined time since the charging operation is started, if the potential of the node NVF exceeds the threshold voltage Vth_ref, the charging operation is stopped. Then, charging is performed again when the potential of the node NVF decreases to the threshold voltage Vth_ref.

Hence, as long as there is power supply, the potential of the node NVF is ensured to be equal to or higher than the threshold voltage Vth_ref. That is, the potential of the node NVF is maintained at a voltage level equal to or higher than the threshold voltage Vth_ref until immediately before the power supply is lost. Accordingly, if a period for the charging voltage of the capacitor CF to be discharged from Vth_ref to the determination threshold voltage Vth_jdg for flag determination exceeds 2 seconds, a flag holding period of more than 2 seconds can be secured.

Figure 11B:
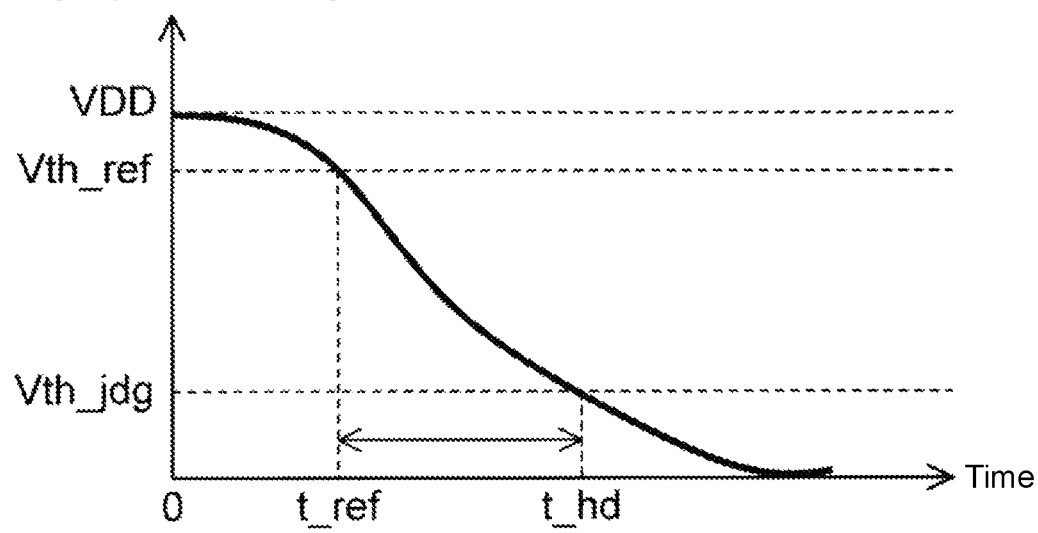
FIG. 11B illustrates a relationship between refresh determination threshold and flag determination threshold.

FIG. 11B illustrates a relationship between the threshold voltage Vth_ref for refresh determination and the determination threshold voltage Vth_jdg for flag determination. When it is assumed that the charging voltage of the capacitor CF at the moment at which the power supply is lost is Vth_ref, if a period from that moment until the charging voltage of the capacitor CF (from t_ref to t_hd shown in the figure) is discharged to a level corresponding to the determination threshold voltage Vth_jdg for flag determination exceeds 2 seconds, the flag holding period in the sessions S2, S3 and SL in accordance with the EPC™ global standard for the EPC can be secured.

Like the flag holding circuit 100 of Embodiment 1, in the flag holding circuit 200 of the present embodiment, since the leakage suppression switch driver SD generates the leakage control signal NCS having the signal level twice VDD and supplies it to the gate of the leakage suppression switch MSL, there is no need to separately provide the dedicated regulator. Accordingly, according to the flag holding circuit 200 of the present embodiment, it is possible to set and hold a flag while suppressing an increase in circuit scale.

In addition, in the flag holding circuit 200 of the present embodiment, after charging of the capacitor CF is started, the charging operation is stopped after the lapse of the predetermined period, and every time the potential of the node NVF falls below the threshold voltage Vth_ref, the leakage suppression switch driver SD is operated and the capacitor CF is re-charged. Hence, operating current can be considerably reduced.

For example, unlike the flag holding circuit 200 of the present embodiment, if the clock signal clk is continuously applied to the leakage suppression switch driver SD during writing of the flag 1, a through current continuously occurs in the NAND gate or the inverter in the leakage suppression switch driver SD.

In contrast, in the flag holding circuit 200 of the present embodiment, a through current caused by the operation of the leakage suppression switch driver SD occurs during a time interval (0 to t_ref in FIG. 11B) in which the charging voltage of the capacitor CF is discharged and decreases from the vicinity of the power supply voltage VDD to the threshold voltage Vth_ref. An effective value of the operating current caused by the through current is expressed by the following equation (1).

$$I_{rms} = \sqrt{\frac{1}{t_1 - t_0} \cdot \int_{t_0}^{t_1} \{I(\tau)\}^2 d\tau} \quad (1)$$

For example, when it is assumed that a frequency of the clock signal clk is 1 MHz (period: 1 μsec), the time interval (t1-t0) for discharging from the vicinity of the power supply voltage VDD to the threshold voltage Vth_ref is 1 second, and 16 clock cycles are required for performing the charging operation once, the effective value of the operating current caused by the through current can be reduced to about $1/250$ ($=4/1000$: square root of $16 \times 10^{-6}$).

Accordingly, according to the flag holding circuit 200 of the present embodiment, it is possible to hold a flag for a certain period or longer (for example, a period of more than 2 seconds) while suppressing the operating current.

Moreover, the disclosure is not limited to the above embodiments. For example, in the above embodiments, a configuration has been explained in which the leakage suppression switch driver SD generates the leakage control signal NCS whose signal level changes so that the maximum value becomes twice the power supply voltage VDD and supplies the leakage control signal NCS to the gate of the leakage suppression switch MSL. However, the signal level of the leakage control signal NCS is not limited to twice the power supply voltage VDD. That is, the leakage suppression switch driver SD may supply the leakage control signal NCS having a signal level higher than the power supply voltage VDD to the gate of the leakage suppression switch MSL so that the gate voltage of the leakage suppression switch MSL becomes larger than the source-drain voltage of the leakage suppression switch MSL.

In addition, in the above embodiments, a case has been explained where the source of the leakage suppression switch MSL formed of an N-channel MOS transistor is connected to the node NVF and the drain is connected to the node NFS. However, one of the source and the drain of the leakage suppression switch MSL may be connected to the node NFS and the other may be connected to the node NVF.

In addition, in the above embodiments, a case has been explained where the drain of the transistor MDS is connected to the other terminal of the current source ID and the source is connected to the node NVD. However, one of the source and the drain of the transistor MDS may be connected to the current source ID and the other may be connected to the node NVD.

What is claimed is:

1. A flag holding circuit, mounted on a radio frequency identification (RFID) tag circuit that receives power supply by means of electric waves from a reader/writer device, and transmits and receives information to and from the reader/writer device by short distance wireless communication, and configured to receive setting of a flag having a value of 0 or 1 used for transmitting and receiving the information and hold the flag, wherein the flag holding circuit comprises:
   a capacitor;
   a flag setting part, connected to a voltage supply line supplying a power supply voltage based on the power supply from the reader/writer device, receiving supply of an input signal and charging the capacitor according to the input signal;
   a flag determination part, outputting an output signal representing 0 or 1 based on a charging voltage of the capacitor; and
   a discharging part discharging the capacitor, wherein
      the capacitor has one terminal connected to a connection line connecting the flag determination part and the discharging part and an other terminal grounded, and
      the flag setting part comprises:
         a leakage suppression switch, having a first terminal connected to the connection line and a second terminal connected to the voltage supply line or a grounding line according to a signal level of the input signal, and connecting or disconnecting the voltage supply line or the grounding line to or from the connection line according to a leakage control signal supplied to a control terminal; and
         a leakage suppression switch control part, receiving supply of a clock signal, generating the leakage control signal whose signal level changes to a value greater than the power supply voltage according to the clock signal and supplying the leakage control signal to the control terminal of the leakage suppression switch.

2. The flag holding circuit according to claim 1, wherein the leakage suppression switch control part generates the leakage control signal in which a maximum value of the signal level becomes twice the power supply voltage according to the clock signal, and supplies the leakage control signal to the control terminal of the leakage suppression switch.

3. The flag holding circuit according to claim 2, wherein the leakage suppression switch control part receives supply of a writing control signal indicating a flag setting period, generates, as the leakage control signal, a signal whose signal level changes between the power supply voltage and a voltage twice the power supply voltage during the flag setting period, and supplies the leakage control signal to the control terminal of the leakage suppression switch.

4. The flag holding circuit according to claim 1, wherein the leakage suppression switch comprises a MOS transistor, one of a source and a drain of the MOS transistor is connected to the connection line as the first terminal, and the other is connected to the voltage supply line or the grounding line as the second terminal, and a gate thereof receives the leakage control signal as the control terminal.

5. The flag holding circuit according to claim 1, comprising:
   a refresh determination part, determining whether or not a voltage of the connection line exceeds a predetermined threshold; and
   an operation control part, controlling operation of the leakage suppression switch control part based on a determination result of the refresh determination part, wherein
   if it is determined that the voltage of the connection line is equal to or lower than the predetermined threshold, the operation control part causes the leakage suppression switch control part to supply the leakage control signal to the control terminal of the leakage suppression switch; and
   if it is determined that the voltage of the connection line exceeds the predetermined threshold, the operation control part causes the leakage suppression switch control part to stop supplying the leakage control signal to the control terminal of the leakage suppression switch.

6. The flag holding circuit according to claim 5, wherein the refresh determination part comprises a Schmitt inverter receiving at an input terminal an input of an inverted voltage obtained by inverting a potential of the connection line, and outputting from an output terminal a determination result indicating whether or not the voltage of the connection line exceeds the predetermined threshold based on comparison results between the inverted voltage and a first threshold and between the inverted voltage and a second threshold.

7. A semiconductor circuit, comprising:
   a flag setting part, connected to a power supply voltage and a first node, supplying the power supply voltage to the first node or cutting off the supply of the power supply voltage according to an input signal;
   a capacitor, connected to the first node and charged with the power supply voltage;
   a flag determination part, connected to the first node and determining a flag based on a charging voltage of the capacitor; and
   a discharging part, connected to the first node and discharging the capacitor, wherein
   the flag setting part comprises:
      a leakage suppression switch, receiving supply of the input signal, connected to a voltage supply line or a grounding line according to a signal level of the input signal, and connecting or disconnecting the voltage supply line or the grounding line to or from the first node according to a leakage control signal supplied to a control terminal; and a leakage suppression switch control part, receiving supply of a clock signal, generating the leakage control signal whose signal level changes to a value greater than the power supply voltage according to the clock signal and supplying the leakage control signal to the control terminal of the leakage suppression switch.

8. A flag holding method executed by the flag holding circuit according to claim 5, the flag holding method comprising:

receiving power supply from the reader/writer device;

receiving the supply of the input signal and the clock signal;

charging the capacitor according to the input signal;

outputting the output signal representing 0 or 1 based on the charging voltage of the capacitor; and discharging the capacitor, wherein charging the capacitor according to the input signal comprises:

determining whether or not the voltage of the connection line exceeds the predetermined threshold; and if it is determined that the voltage of the connection line is equal to or lower than the predetermined threshold, causing the leakage suppression switch control part to supply the leakage control signal to the control terminal of the leakage suppression switch; and if it is determined that the voltage of the connection line exceeds the predetermined threshold, causing the leakage suppression switch control part to stop supplying the leakage control signal to the control terminal of the leakage suppression switch.

* * * * *